United States Patent [19]

Kataoka et al.

[11] Patent Number: 5,638,060
[45] Date of Patent: Jun. 10, 1997

[54] SYSTEM SWITCH DEVICE

[75] Inventors: Ichiro Kataoka; Masao Suzuki, both of Shizuoka, Japan

[73] Assignee: Yazaki Corporation, Tokyo, Japan

[21] Appl. No.: 136,248

[22] Filed: Oct. 15, 1993

[30] Foreign Application Priority Data

Oct. 15, 1992 [JP] Japan ............................ 4-277065

[51] Int. Cl.⁶ .................................................. H03K 17/94
[52] U.S. Cl. .......................... 341/20; 341/27; 340/438; 340/461; 345/156; 345/173; 364/188; 364/190
[58] Field of Search .................................. 345/117, 156, 345/173; 341/22, 26, 21, 23, 20, 27; 364/188–189, 190, 709.11, 709.01; 340/461, 438

[56] References Cited

U.S. PATENT DOCUMENTS

| | | | |
|---|---|---|---|
| 4,218,603 | 8/1980 | Satoh | 200/312 |
| 4,942,514 | 7/1990 | Miyazaki et al. | 364/190 |
| 4,992,779 | 2/1991 | Sugino et al. | 341/20 |
| 5,055,838 | 10/1991 | Wise et al. | 341/27 |
| 5,121,091 | 6/1992 | Fujiyama | 341/27 |
| 5,121,442 | 6/1992 | Togawa et al. | 345/156 |
| 5,189,390 | 2/1993 | Fagard | 340/407 |
| 5,305,014 | 4/1994 | Mutschler et al. | 345/173 |
| 5,327,160 | 7/1994 | Asher | 345/156 |
| 5,341,133 | 8/1994 | Savoy et al. | 341/26 |
| 5,412,402 | 5/1995 | Searby et al. | 345/173 |
| 5,432,671 | 7/1995 | Allavena | 361/280 |

*Primary Examiner*—Jeffery Hofsass
*Assistant Examiner*—Ashok Mannava
*Attorney, Agent, or Firm*—Sughrue, Mion, Zinn, Macpeak & Seas

[57] ABSTRACT

An object of this invention is to provide a system switch device having a board switch and a display unit separated from the latter, with which terminals units can be operated in a blind touch mode. The system switch device comprises: a board switch having switches and touch-operated mechanisms which give a sense of contact to the finger of the operator in response to the key operations of the switches, an electronic control unit operating to control terminal units according to switch signals from the board switch; and a display unit for displaying a selected content according to a switch signal from the board switch with the aid of the electronic control unit. In the device, with respect to an optional switch position in a key operation of the board switch, the center of the screen of the display unit is displayed in a predetermined display color, and the switch position in the following key operation is displayed on the display unit by causing the electronic control unit to calculate its amount of movement with the switch position inputted before as a reference, so that the key operation is performed according to the content displayed on the display unit.

7 Claims, 8 Drawing Sheets a : AIR CONDITIONER
b : RADIO
c : CASSETTE

SYSTEM SWITCH DEVICE

BACKGROUND OF THE INVENTION

1. Field of the Invention

This invention relates to a system switch device which comprises a board switch, a display unit for displaying selected contents, and an electronic control unit for controlling terminal units according to the selected contents which are displayed through they key operations of the board switch.

2. Related Art

Recently, there have been strong demands for insuring safety in traveling a motor vehicle, improving comfortability inside it, and providing functions high in added value for it. In order to meet those demands, there is a tendency to install a number of electronic devices for processing vehicle data, external environmental data, man-machine data, external communications data, and other data. Those control devices mounted on a motor vehicle are intricate in arrangement, tending to be developed in technology.

It is necessary for the driver of the motor vehicle to transmit his wills or intentions quickly to those electronic devices while correctly judging driving conditions and environmental conditions from those variety of data. His wills or intentions are transmitted through switches. Accordingly, when those control units are installed on the vehicle, it is also necessary to install a number of switches on the dashboard. Those switches may be collected at one position by the following method: Switches are displayed on the screen of a CRT (cathode ray tube), and items in a menu are selected by touching the screen of the CRT, thereby to control, for instance, an audio device, and an air conditioner.

As was described above, in order to satisfy the variety of demands, it is necessary to install a number of electronic devices on the vehicle, and accordingly a number of switches must be arranged on the instrument board or the like. As the number of switches installed is increased, it becomes difficult for the driver to suitably operate all of the switches. On the other hand, it is necessary to improve the switches so that the driver's will is transmitted to the electronic devices with high efficiency.

The above-described method in which switches are displayed on the screen of a CRT, and for instance an audio device or an air conditioner is controlled merely by touching the screen of the CRT, suffers from the following difficulties: In the method, the switches are provided on the screen of the CRT. The CRT occupies a relatively large area for the CRT, and accordingly the provision of the CRT is limited in position. Furthermore, since the switches are integral with the display unit, the driver cannot operate the switches without changing his posture; more specifically, without turning his eyes. In addition, with the method, the driver is liable to use a lot of time for operating the switches during driving, which may adversely affect safety driving. Thus, the conventional method should be improved for safety driving.

SUMMARY OF THE INVENTION

In view of the foregoing, an object of this invention is to provide a system switch device in which a board switch is separated from a display unit, and terminal units can be operated in a blind touch mode.

The foregoing object of the invention has been achieved by the provision of a system switch device which, according to one aspect of the invention, comprises:

a board switch having a plurality of switches and touch-operated mechanisms which give a sense of contact to the finger of the operator in response to the key operations of the switches;

an electronic control unit for controlling terminal units according to switch signals from the board switch; and a display unit for displaying selected contents according to the switch signals from the board switch with the aid of the electronic control unit, wherein with respect to an optional switch position in a key operation of the board switch, the center of the screen of the display unit is displayed in a predetermined display color, and the amount of movement of a switch position in the following key operation is calculated by the electronic control unit with the switch position inputted before as a reference, to display a switch position corresponding to the amount of movement on the display unit.

Furthermore, provided according to another aspect of the invention is a system switch device which comprises:

a board switch including signal generating means for generating switch signals in association with the key operations of switches, and touch-operated mechanisms for giving a sense of contact to the finger of the operator in response to the key operations;

converting means for converting the switch signals from the signal generating means into position signals, memory means for storing the position signals provided by the converting means;

calculating means for calculating amounts of movement by using the position signals stored in the memory means; and displaying means for displaying a switch position provided by the calculating means, wherein the amounts of movement is utilized for displaying selected contents and controlling the respective terminal units.

In the above-described devices, the end portion of each of the touch-operated mechanisms of the board switch is moved up and down in association with the key operation, thus giving a sense of contact to the finger of the operator, or each of the touch-operated mechanisms of the board switch comprises a piezo-electric element to vibrate the finger of the operator.

In addition, provided according to another aspect of the invention is a system switch device which comprises:

a board switch having a plurality of switches and touch-operated mechanisms which give a sense of contact to the finger of an operator in response to the key operations of the switches, an electronic control unit for controlling terminal units according to switch signals from the board switch; and a display unit for displaying a selected content according to a switch signal from the board switch with the aid of the electronic control unit, wherein the display unit is arranged in front of the operator, the board switch is arranged near the operator, with an optional switch position in a key operation of the board switch stored, the center of the screen of the display unit is displayed in a predetermined display color, the electronic control unit calculating the amount of movement of a switch position inputted before as a reference, and depending on whether or not the amount of movement thus calculated has a predetermined value, the display color of the display unit and the sense of contact given to the finger being changed.

In the system switch device designed as described above, with the optional switch position as a reference which is inputted from the board switch by the first key operation, the amount of movement of the switch position inputted by the following key operation is calculated, so that the display at the center of the screen of the display is switched according to the amount of movement thus calculated, and the respective one of the touch-operated mechanisms forming the board switch gives a sense of contact to the finger of the operator, which permits the key operations to be performed in a blind touch mode.

In the case where the amount of movement of the finger from the optional switch origin is not coincident with the predetermined switch position, a display color $C_1$ is used for the display unit. In the case where the amount of movement is coincident with the predetermined switch position, a display color $C_2$ is employed for display. In addition, depending upon whether or not the amount of movement coincides with the predetermined switch position, the senses of contact to be given to the finger are switched, which allows the key operations to be performed more positively in a blind touch mode.

BRIEF DESCRIPTION OF THE DRAWING(S)

Figure 8A:
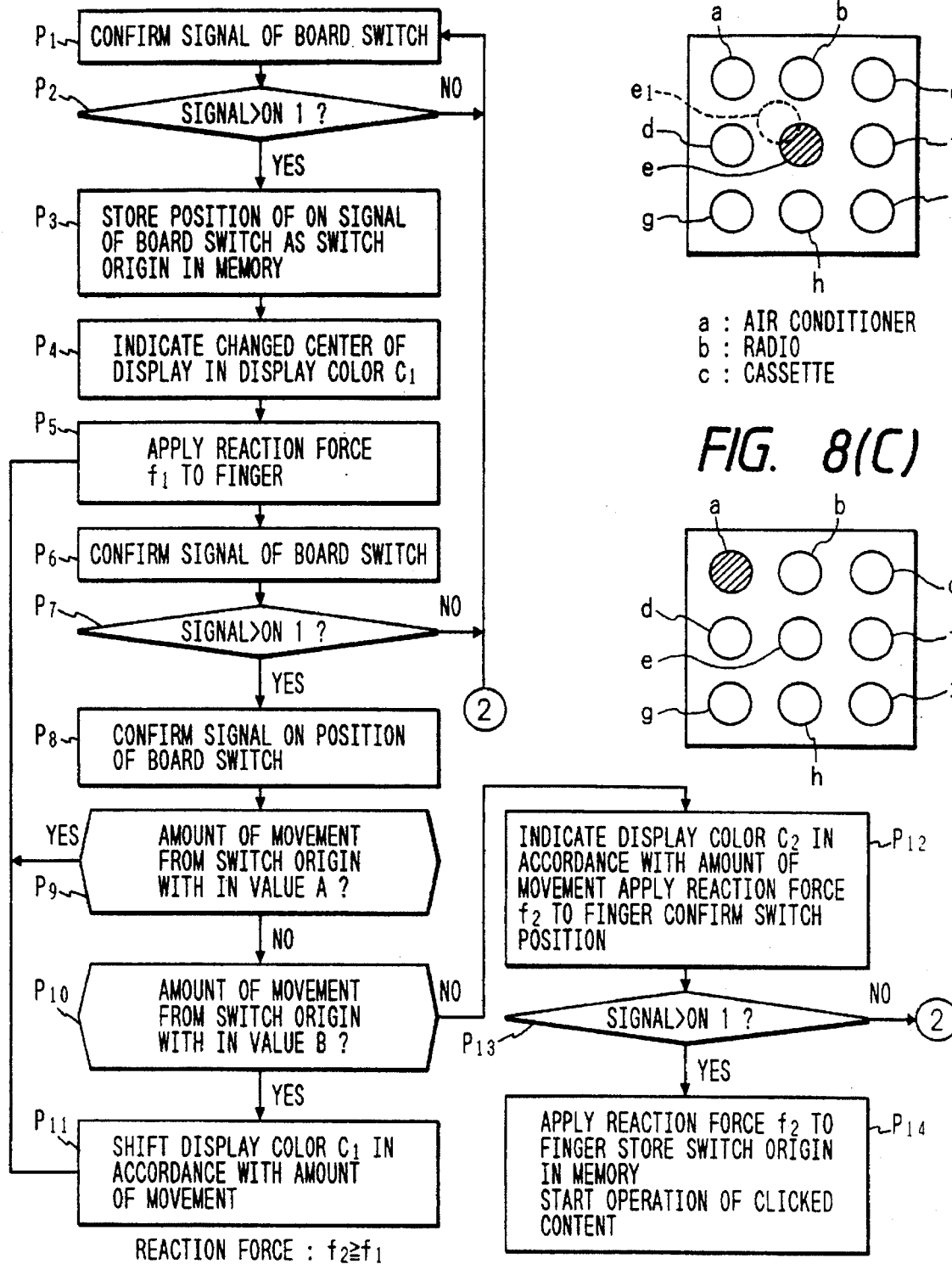
FIG. 8 (A) is a flow chart for a description of another operation of the system switch device of the invention.
Figure 8B:
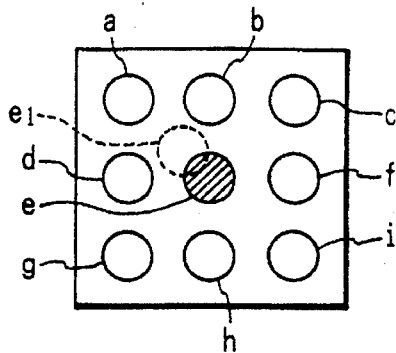
Figure 8C:
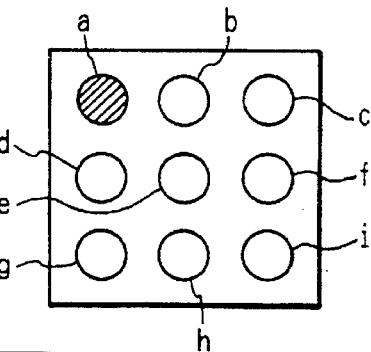
Figure 9A:
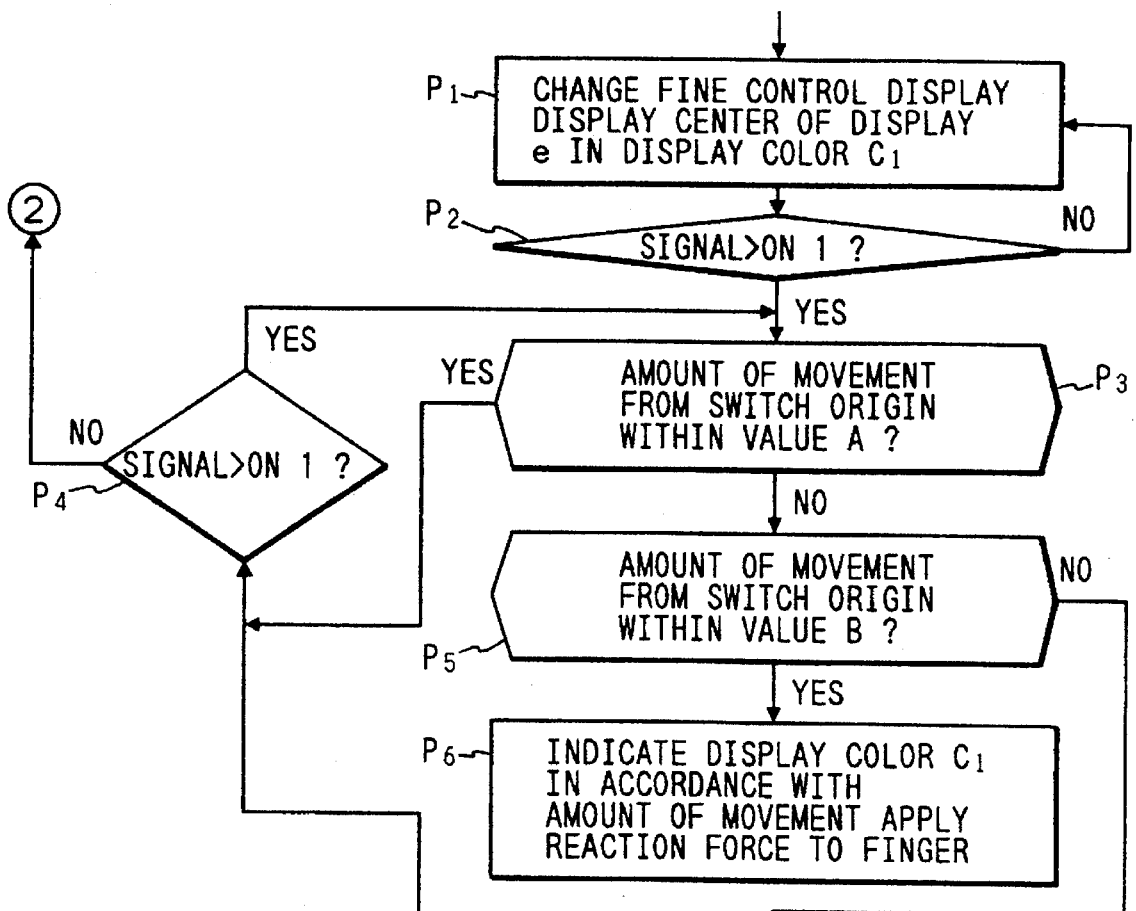
Figure 9B:
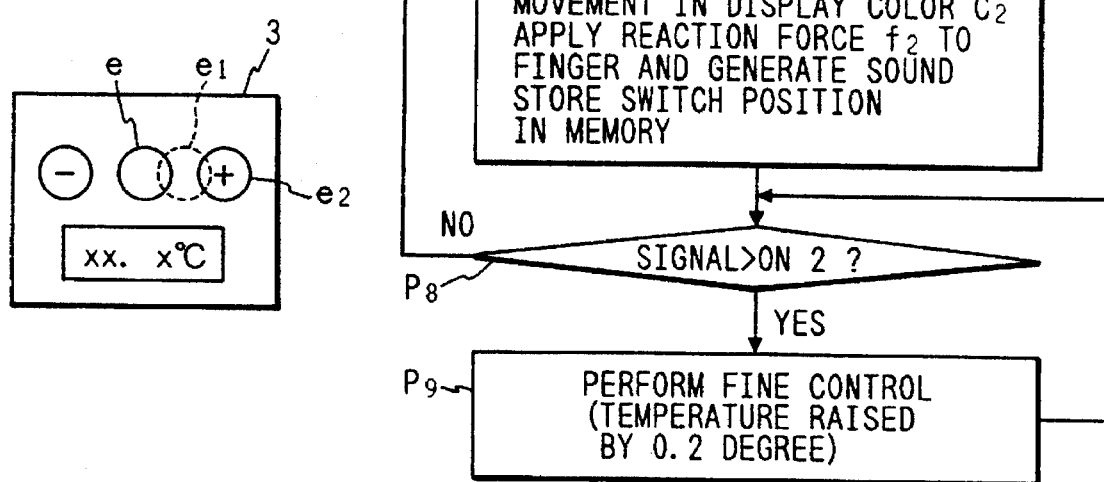

FIG. 8 (B) and (C) are explanatory diagrams showing the board switch;

FIG. 9 (A) is a flow chart for temperature adjustment; and

FIG. 9 (B) is an explanatory diagram showing a display screen for temperature adjustment.

DETAILED DESCRIPTION OF THE PREFERRED EMBODIMENTS

Examples of a system switch device according to this invention will be described with reference to the accompanying drawings.

Figure 1:
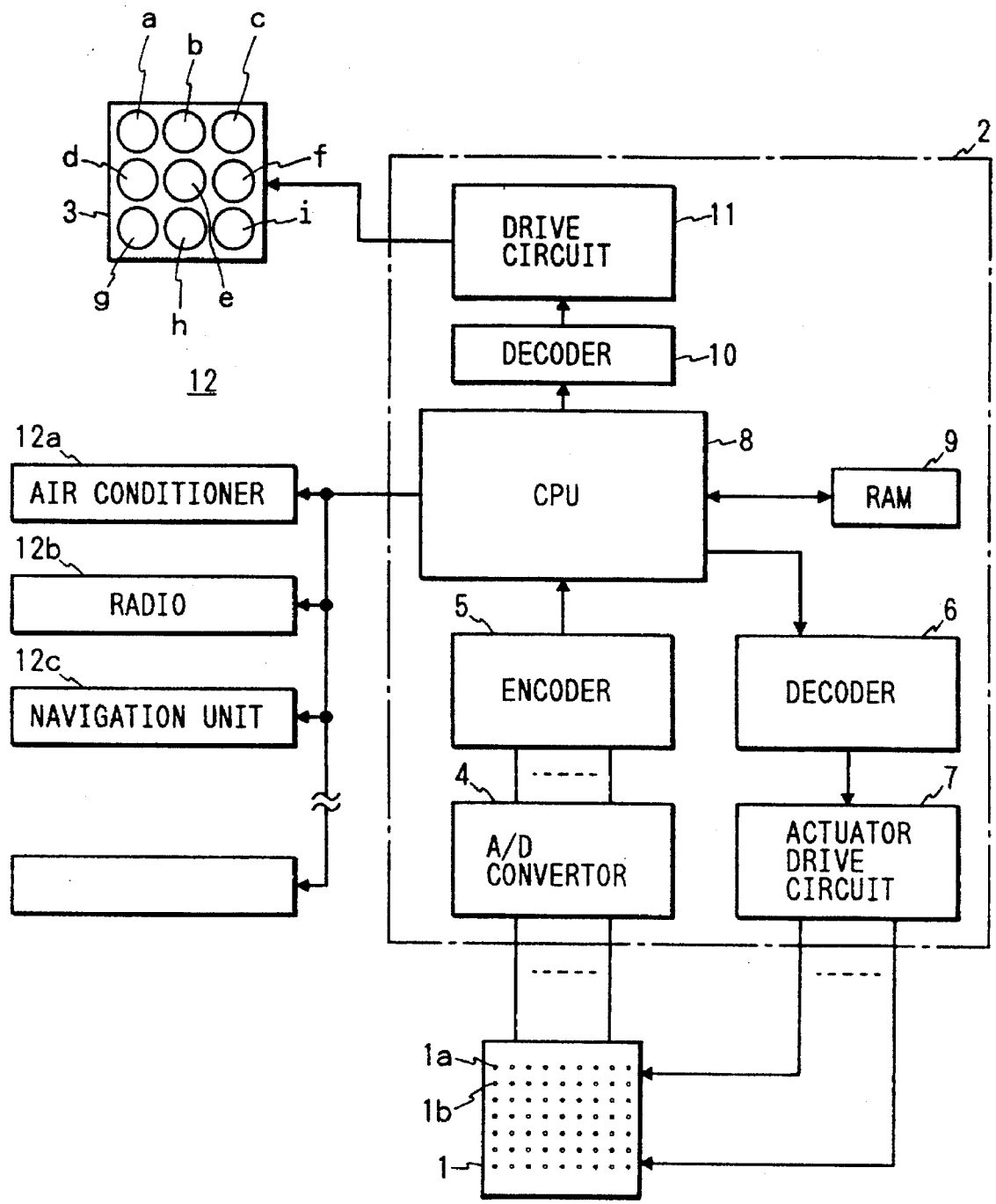
FIG. 1 is a block diagram showing the arrangement of one example of a system switch device according to this invention.

FIG. 1 is a block diagram showing a first example of the system switch device for a vehicle according to the invention. In FIG. 1, reference numeral 1 designates a board switch comprising switches 1a and touch-operated mechanisms 1b; 2, an electronic control unit; and 3, a display unit. The electronic control unit 2 comprises an A-D (analog-to-digital) converter 4, an encoder 5, a decoder 6, an actuator drive circuit 7, a CPU (central control unit) 8, a RAM 9 (random access memory), and a drive circuit 11. Further in FIG. 1, reference numeral 12 designates terminal units such as an air conditioner 12a, a radio receiver 12b, and a navigation unit 12c.

Figure 2:
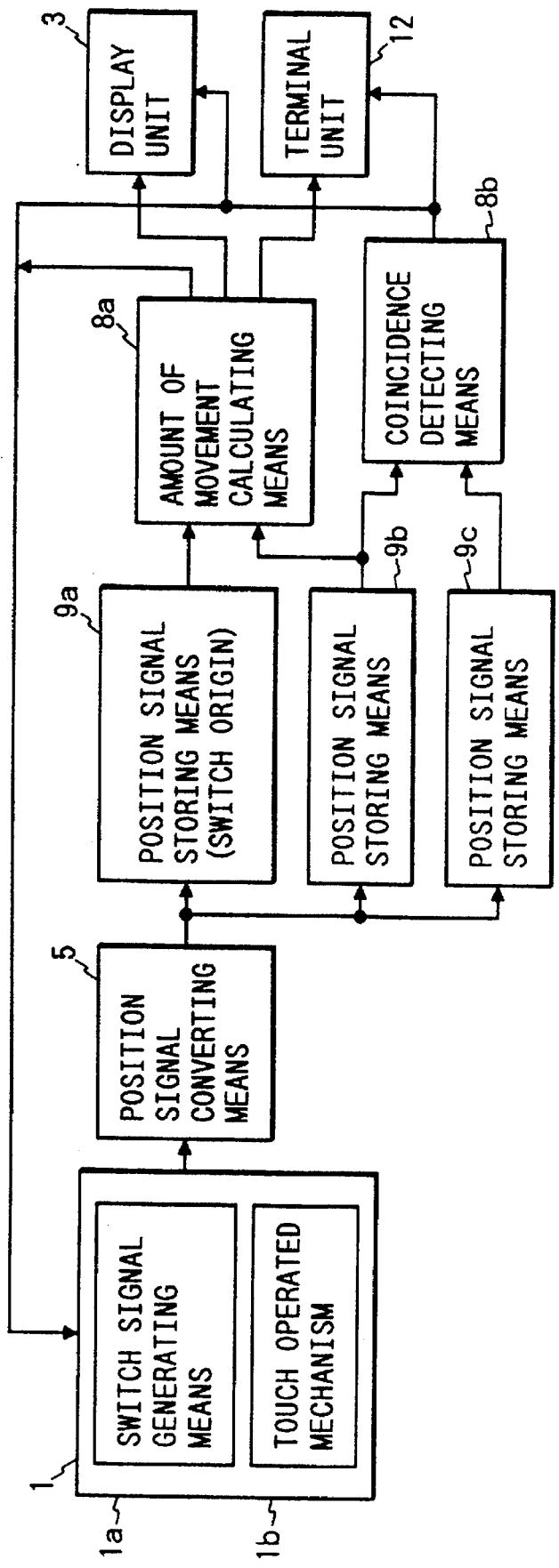
FIG. 2 is a block diagram for a description of the functions of the system switch device shown in FIG. 1.

The functions of the system switch device shown in FIG. 1 will be outlined according to a block diagram of FIG. 2.

A switch signal provided by switch signal generating means 1a of the board switch 1 is coded by position signal converting means (encoder) 5 into a position signal, which is stored in position signal storing means 9a, and a drive signal is applied to a touch-operated mechanism 1b, giving a sense of contact (a reaction force $f_1$) to the finger of the operator. A position signal inputted next is stored in a position signal storing means 9b, and similarly as in the above-described case a drive signal is applied to the touch-operated mechanism 1b. The position signals are read from the position signal storing means 9a and 9b, respectively, and operated by amount-of-movement calculating means 8a, so that the amount of movement (corresponding to the amount of movement of the finger) is calculated, and a content is displayed on the display unit 3. According to the content thus displayed, a key operation is performed, and its switch signal is converted into a position signal, which is stored in another position signal storing means 9c. The position signals are read out of the position signal storing means 9b and 9c, and applied to coincidence detecting means 8b. When it is determined by the coincidence detecting means 8b that those position signals are coincident with each other, the touch-operated mechanism 1b is driven, to give a sense of contact (a reaction force $f_2$) to the finger. As a result, the terminal unit 12 is controlled, or the content displayed on the display unit 3 is changed by the coincidence detecting means 8. The position signal storing means 9a, 9b and 9c correspond to the RAM 9.

The system switch device shown in FIG. 1 will be described with reference to FIGS. 3 and 4 in more detail.

Figure 3:
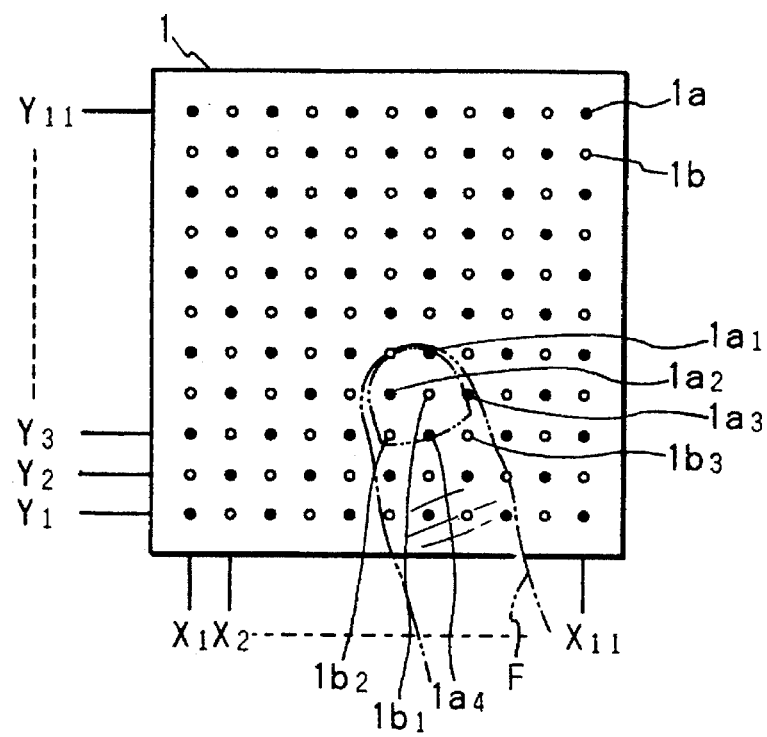
FIG. 3 is a plan view showing a board switch in the system switch device.

In the board switch 1, as shown in FIG. 3, the switches 1a and the touch-operated mechanisms 1b are arranged in matrix form. The board switch 1 is set near the operator. When any one of the switches 1a is pushed with the finger F, the switch signal is produced, while the end portion of the touch-operated mechanism 1b is moved up and down, thus giving a sense of contact (a reaction force) to the finger F. For instance when, as shown in FIG. 3, the switches $1a_1$ through $1a_4$ and the touch-operated mechanisms $1b_1$ through $1b_4$ are pushed with the finger F, the switch signals are applied from the switches $1a_1$ through $1a_4$ to the A-D converter 4, where they are converted into binary signals corresponding to the pressure of the finger F. The binary signals are applied to the encoder 5, where they are converted into position signals corresponding to coordinates (Xn, Yn). The position signals are subjected to addition, and applied to the CPU 8. At the same time, the end portions of the touch-operated mechanisms $1b_1$ through $1b_4$ are moved up and down, thus giving reaction forces to the finger F.

Figure 4:
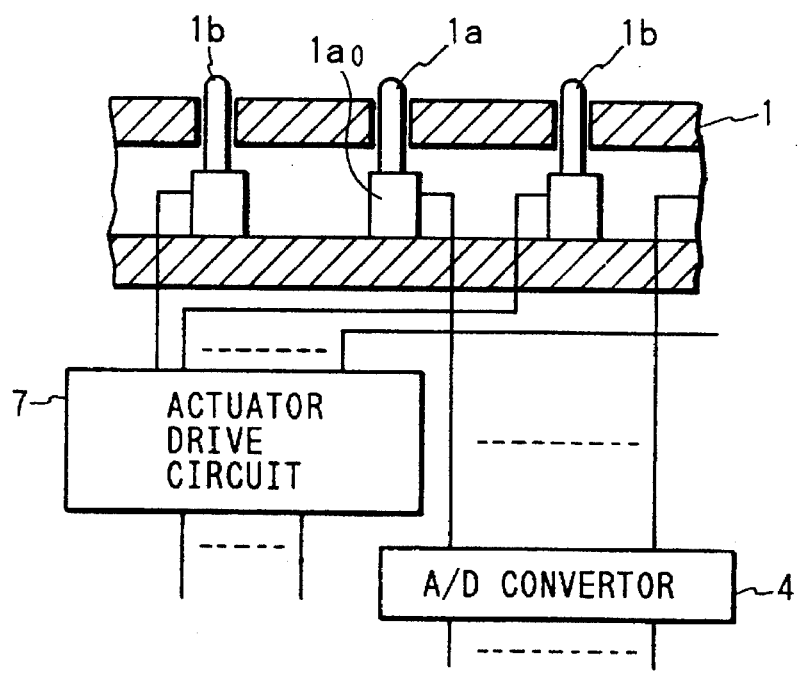
FIG. 4 is a sectional view of the board switch.

FIG. 4 is a sectional view of the board switch 1. Each switch 1a is made up of a piezo-electric element $1a_0$. When the key of the switch 1a is depressed, the piezo-electric element $1a_0$ provides an output corresponding to the pressure applied to the key. The end portion of each touch-operated mechanism 1b is moved up and down in response to a signal from the actuator drive circuit 7.

The electronic control unit 2 has the CPU 8, in which a predetermined programs has been stored, so that the display unit 3 and the terminal units 12 are controlled according to the program in response to the key operations of the board switch 1. The switch signal from the board switch 1 is applied through the A-D converter 4 to the encoder 5, where it is coded into a position signal. The position signal is applied to the CPU 8, and stored in the RAM 9. With the position signal firstly stored in the RAM 9 as a switch origin (or reference) for detection of an amount of movement, the amount of movement of a position signal provided by the next switch key operation is calculated. That is, in the CPU 8, the amount of movement is calculated with the switch origin as a reference. The CPU 8 applies a coded signal corresponding to the amount of movement to the decoder 10, where it is decoded. The output signal of the decoder 10 is applied to the drive circuit 11, so that a content is displayed on the display unit 3 at a predetermined position. The coded signal is further applied to the decoder 6, the output of which is applied to the actuator drive circuit 7, so that the touch-operated mechanism 1b is operated. At the same time, the CPU 8 outputs control signals to control the terminal units 12 such as the air conditioner 12a, the radio set 12b, and the navigation unit 12c.

The display unit 3 displays a shift position, and is provided in front of the switch operator's seat (or the driver's seat). In the case where the display unit 3 is a liquid display unit, the image thereof is displayed as a real image; and in the case where it is a head-up display (HUD) unit, it is displayed as a virtual image far from the driver's seat and above the dash board. The display unit 3 has two different display colors $C_1$ and $C_2$. In the case where an amount of movement on the board switch 1 is not coincident with a predetermined switch position, the display color $C_1$ is used; whereas in the case where it is coincident with the predetermined switch position, the display color $C_2$ is used.

In the case where each of the switches 1a is made up of a piezo-electric element as was described before, voltage may be applied to the piezo-electric element to vibrate it thereby to apply a reaction force to the finger. In this case, the touch-operated mechanisms 1b may be eliminated because the switches 1a have the function of the contact-operated mechanisms 1b.

The switches 1a are not always limited to those which have been described above. For instance, they may be automatic-return type mechanical contact means, or the automatic-return type mechanical contact means combined with piezo-electric elements. In addition, the arrangement of the switches $1a_1$... and the touch-operated mechanisms $1b_1$... is not always limited to that which is shown in FIG. 2.

Figure 5:
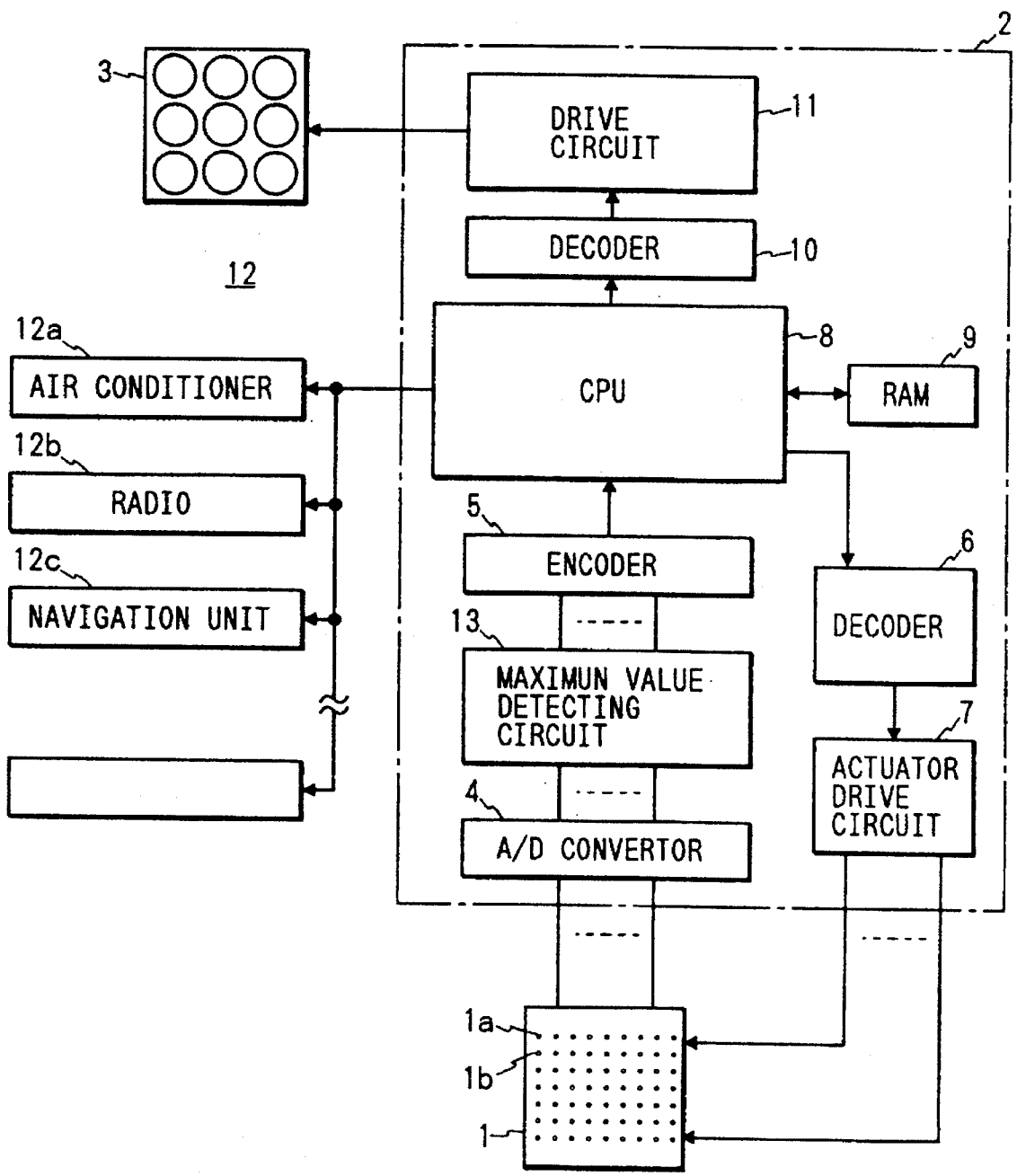
FIG. 5 is a block diagram showing the arrangement of another example of the system switch device according to the invention.

Another example of the system switch device according to the invention is as shown in FIG. 5.

In FIG. 5, parts corresponding functionally to those which have been described with reference to FIG. 1 are therefore designated by the same reference numerals or characters. The device of FIG. 5 is different from the one of FIG. 1 only in that the output of the A-D converter 4 is supplied to a maximum value detecting circuit 13. The maximum value detecting circuit 13 receives a plurality of digital signals from the A-D converter 4, and selects one of them as a switch signal which corresponds to the greatest of the finger's pressures acting on the board switch 1.

In this connection, it is obvious that the switch signal may be determined as follows: when the A-D converter 4 outputs a plurality of digital signals, the CPU 8 detects the maximum in level of them, and employs it as the switch signal.

A control method using the system switch device shown in FIG. 1 will be described with reference to a flow chart, FIGS. 6 and 7. The key operation is performed with the finger touching the board switch 1.

Figure 6:
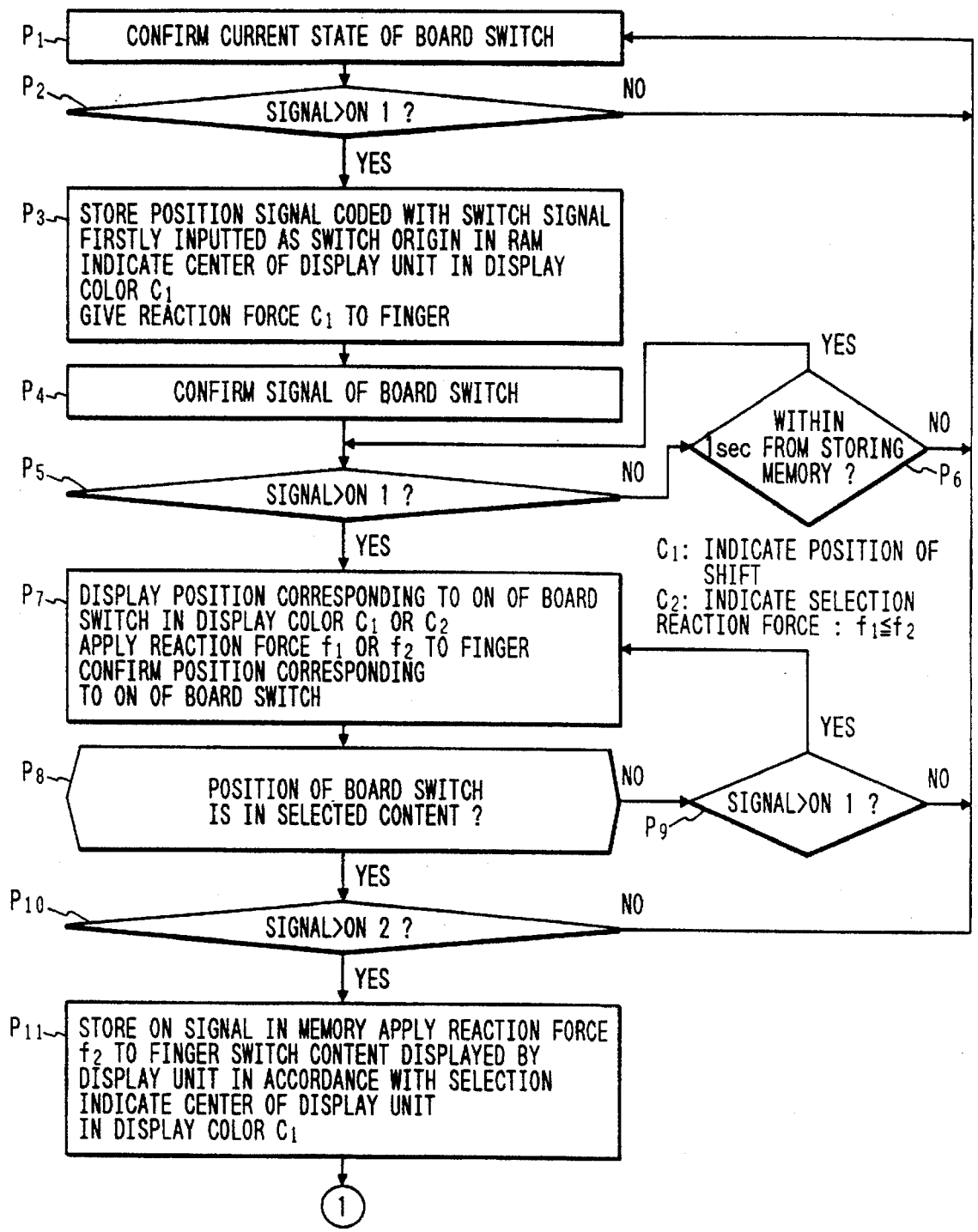
FIGS. 6 and 7 are two parts of a flow chart for a description of one operation of the system switch device according to the invention.

As shown in FIG. 6, in Step $P_1$ the key operator confirms the current state of the board switch by watching the display unit 3, and in Step $P_2$ he performs the key operation. In Step $P_3$, a position signal, which is coded with the switch signal firstly inputted by the key operation as a switch origin, is stored in the RAM 9 with the aid of the CPU 8. The drive circuit 11 is operated through the decoder 10 according to the optional position signal thus firstly inputted, so that the center e of the display unit is indicated in the display color $C_1$. On the other hand, the decoder 6 and the actuator 7 are operated, so that the end portion of the touch-operated mechanism 1b is moved up and down to give a sense of contact (a reaction force $f_1$) to the finger F.

In Step $P_4$, the key operator refers to the display unit 3 to confirm the switch origin inputted by the key operation. Thereafter, in Step $P_5$ a key operation is performed. That is, the key operation is carried out within one second of the storing of the coded position signal in the RAM 9. If in Step $P_5$ the key operation is not achieved within one second, Step $P_1$ is effected again. In Step $P_7$, the position on the display unit 3 which corresponds to the position signal provided by the key operation in Step $P_5$ is displayed in the display color $C_1$ or $C_2$. At the same time, the end portion of the contact-operated mechanism 1b is moved to apply a reaction force $f_1$ or $f_2$ to the finger F. The display color $C_1$ is used to indicate the position of shift from the switch origin, and the reaction force $f_1$ is applied to the finger F. When the position signal coincides with the predetermined switch position, and the selected content is displayed, the display color $C_2$ is used for display, and the reaction force $f_2$ is applied to the finger F. The relation between the reaction forces $f_1$ and $f_2$ is set as follows:

$$f_1 \leq f_2$$

In Step $P_6$, it is determined whether or not the switch position provided by the key operation in Step $P_7$ is for a selected content. When the display color $C_1$ is shown on the display unit 3, Step $P_9$ is effected; that is, the key operation is performed again, and then Step $P_7$ is effected. Those key operations cause the display unit 3 to show the display color $C_2$, Step $P_{10}$ is effected. That is, the switch 1a at the same position is struck hard, to select the content displayed on the display unit 3. This position signal is stored, as a switch origin (a reference signal) in the RAM 9, and the reaction force $f_2$ is applied to the finger F. In Step $P_{11}$, the content displayed by the display unit 3 is switched, and the center e of the display unit 3 is indicated in the display color $C_1$ with the switch position inputted before as a switch origin.

Figure 7:
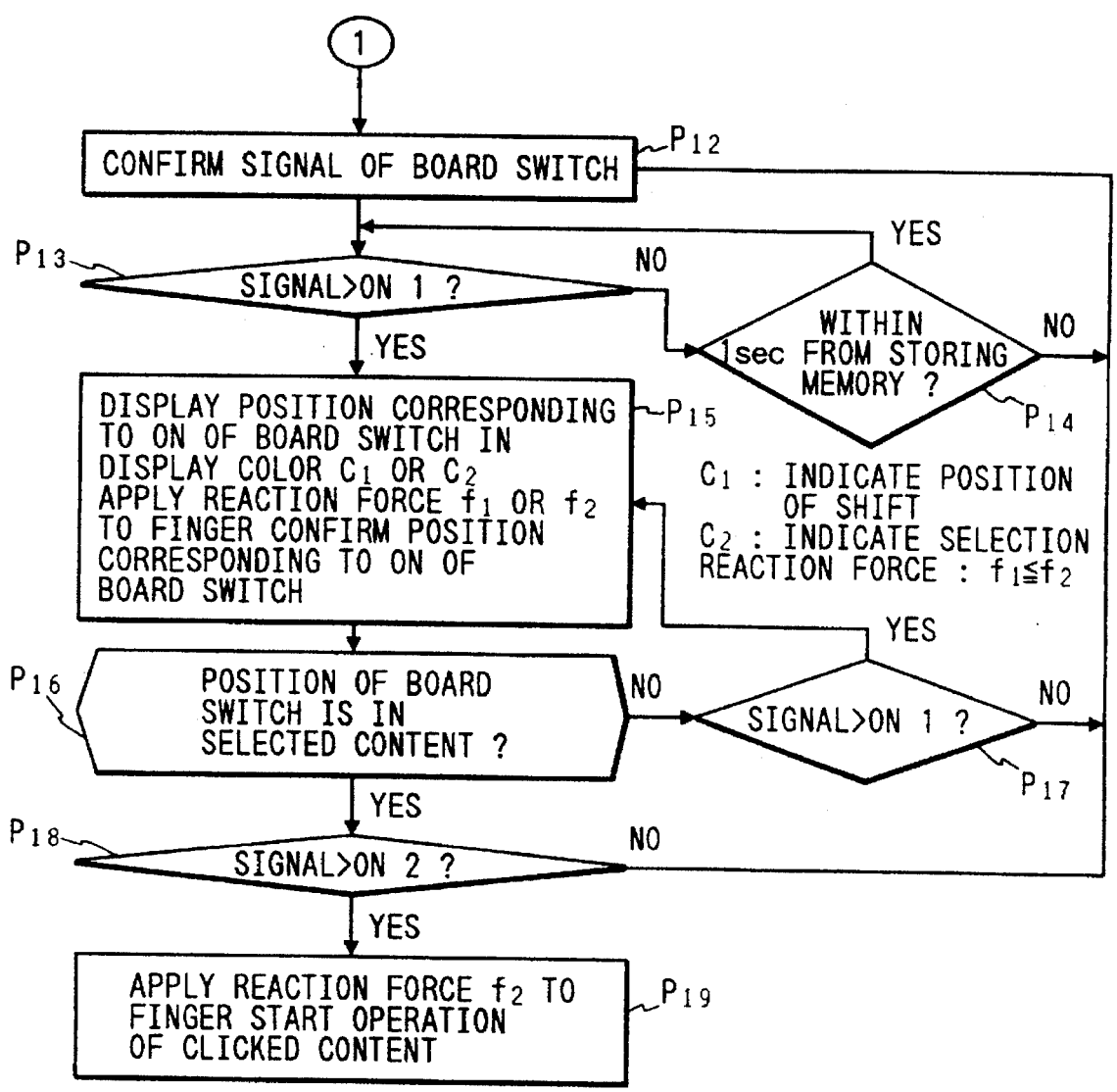

Next, Step $P_{12}$ shown in FIG. 7 is effected; that is, the signal of the board switch 1 is confirmed. Thereafter, Step $P_{13}$ is effected. That is, in Step $P_{13}$, a key operation is carried out. In Step $P_{15}$, the position on the display unit 3 which corresponds to the switch position on the board switch 1 is indicated in the display color $C_1$, and the reaction force $f_1$ is applied to the finger F. When the switch position agrees with a content to be selected, it is displayed in the display color $C_2$, and the reaction force $f_2$ is applied to the finger F. Next, Step $P_{16}$ is effected. In the case where the content indicated is to be selected, in Step $P_{18}$ the key of the board switch 1 is struck hard. Thereafter, Step $P_{19}$ is effected. In Step $P_{19}$, the reaction force $f_2$ is applied to the finger, and the operation of the clicked content (driving of the air conditioner) is started. In the case where the content displayed on the display unit is not to be selected, Step $P_{17}$ is effected, so that a key operation is carried out again.

An example of a method of detecting an amount of movement provided by the key operation of the board switch will be described with reference to FIG. 8.

The part (A) of FIG. 8 shows a method in which the amount of shift from the switch origin in the first key operation is compared with values A and B, to reach an aimed content. Steps $P_1$ through $P_8$ are substantially equal to Steps $P_1$ through $P_3$ in the flow chart of FIG. 6. The switch position inputted in Step $P_2$, and the amount of shift; i.e., the amount of movement (corresponding to the amount of movement of the finger) are detected in Steps $P_9$ and $P_{10}$. In Step $P_9$, it is determined whether or not the amount of movement is within a value A. When it is determined that the amount of movement is within the value A, the switch position is within the range of the center e, and therefore Step $P_5$ is effected again, and in Step $P_7$ a key operation is carried out again. When the amount of movement is not within the value A, Step $P_{10}$ is effected, to determine whether or not the amount of movement is within a value B. When the amount of movement is within the value B, Step $P_{11}$ is effected. That is, as shown in the part (B) of FIG. 8, a position $e_1$ shifted from the center of the display unit is indicated in the display color $C_1$, and thereafter Step $P_5$ is effected again. When, in Step $P_{10}$, the amount of movement is not within the value B, then Step $P_{12}$ is effected. That is, the display position a in the direction of movement of the finger is displayed in the display color $C_2$, and the reaction force $f_2$ is applied to the finger. And when, with the switch position confirmed, the content (starting of the air conditioner) thus displayed is the aimed one, in Step $P_{13}$ a key operation is performed. In Step $P_{14}$, the reaction force $f_2$ is applied to the finger, and the switch position is stored, as a switch origin, in the RAM 9, and the operation of the clicked content (or selected content) is started.

The part (A) of FIG. 9 is a flow chart for temperature adjustment of an air conditioner with the system switch device.

In Step $P_1$, the temperature adjustment of the air conditioner is selected, and as shown in the part (B) of FIG. 9 the temperature adjustment is displayed on the display unit 3, and the center e is shown in the display color $C_1$. In Step $P_2$, a key operation is performed. When, in Step $P_3$, the amount of movement of the switch position is within a value A, Step $P_4$ is effected; that is, the key operation is performed again. When the amount of movement is not within the value A, Step $P_5$ is effected. When the amount of movement is within a value B, Step $P_6$ is effected. That is, as shown in the part (B) of FIG. 9 a position $e_1$ shifted from the center is displayed, and the reaction force $f_1$ is applied to the finger, and the key operation of Step $P_4$ is performed. When the amount of movement is not within the value B, Step $P_7$ is effected. That is, a display position $e_2$ corresponding to the amount of movement is shown in the display color $C_2$, and the reaction force $f_2$ is applied to the finger while sound is generated, and this switch position is stored, as a switch origin, in the memory. When in Step $P_8$ a key operation is performed, then the set temperature is raised by 0.2 degree in Step $P_9$. By repeatedly performing the key operation in Step $P_8$, the set temperature is raised stepwise. In association with the key operation, the reaction force $f_2$ gives a sense of contact to the finger, thus facilitating the key operation.

The relation between pressures for striking the switch 1a may be $ON1 \leq ON2$. The relation between the reaction forces $f_1$ and $f_2$ may be $f_1 \leq f_2$. Vibration may be employed to give a sense of contact to the finger. It goes without saying that the key operation can be achieved more readily if sound is produced in association with it.

In the above-described embodiment, with an optional switch signal of the board switch 1 as a switch origin the center of the screen of the display unit is shown in the display color, and with the switch origin as a reference the amount of movement is calculated to perform the switching operation as desired. In this connection, it goes without saying that the following method may be employed: A range in which the center of the display unit 3 is displayed (which is stored as a switch origin) is set on the surface of the board switch 1, and when the position signal is from the switch position which is outside the range, the key operation is performed again.

The method of detecting the amount of movement is not always limited to what has been described above. That is, it is obvious that a variety of methods may be employed for detection of the amount of movement.

With the system switch device according to the invention, a switch signal from the board switch is converted into a position signal, and the position signal is supplied to the electronic control unit, so that the amount of movement from an optional switch origin is calculated by the electronic control unit. The amount of movement is displayed in the predetermined display color according to it value in front of the key operator with the aid of the display unit. Therefore, the operator can perform the key operation while confirming the displayed content; that is, the key operation can be achieved in a blind touch mode. Furthermore, in association with the key operation the reaction force gives a sense of contact to the finger, which facilitates the key operation.

In the case where the system switch device of the invention is applied to a vehicle, the display unit such as a head-up display unit can be provided in the direction of movement of the vehicle, and the board switch can be set near the key operator. Hence, the operator can perform the key operation in a blind touch mode without turning his eyes, which is considerably effective in safety driving.

What is claimed is:

1. A system switch device comprising:
   a board switch having a plurality of switches, each of said plurality of switches being assigned a position;
   signal generating means for generating a position signal corresponding to the position of one of said plurality of switches when said one of said plurality of switches is activated;
   touch operate means for imparting a tactile sensation to a user in response to activation of one of said plurality of switches, by the user;
   memory means for storing the position signal;
   calculating means for calculating a distance between a switch which is first activated and a next activated switch based on the position signal associated with the first activated switch stored in said memory means and the position signal associated with the next activated switch stored in said memory means;
   electronic control means for controlling terminal units according to the calculated distance;
   display means for displaying a selected content in accordance with the position signal;
   wherein the tactile sensation imparted by said touch operate means is a first tactile feeling when the calculated distance is equal to or less than a predetermined value, and the tactile sensation imparted by said touch operate means is a second tactile feeling when the calculated distance is greater than the predetermined value.

2. A system switch device as claimed in claim 1, wherein the touch operate means is moved up and down in accordance with the activation of one of said plurality of switches to give a sense of contact to the user.

3. A system switch device as claimed in claim 1, wherein the touch operate means includes a piezo electric element to vibrate the object.

4. A system switch device as claimed in claim 1, wherein the center of a screen of the display unit is displayed in a predetermined display color in response to an activation of a switch and wherein said display color is moved on the display unit according to the calculated distance to display a switch position corresponding to the calculated distance on the display unit.

5. A system switch device as set forth in claim 1, wherein each of said plurality of switches has a first setting and a second setting, said first setting for activating said one of said plurality of switches to cause said signal generating means to generate said position signal, and said second setting for causing said electronic control means to control said terminal units.

6. A system switch device comprising:

a board switch having a plurality of switches, each of said plurality of switches being assigned a position;

signal generating means for generating a position signal corresponding to the position of one of said plurality of switches when said one of said plurality of switches is activated;

touch operate means for imparting a tactile sensation to a user in response to activation of one of said plurality of switches, by the user;

memory means for storing the position signal;

calculating means for calculating a distance between a switch which is first activated and a next activated switch based on the position signal associated with the first activated switch stored in said memory means and the position signal associated with the next activated switch stored in said memory means;

electronic control means for controlling terminal units according to the calculated distance;

display means for displaying a selected content in accordance with the position signal;

means for changing a display color based upon whether or not the calculated distance has a predetermined value; and means for providing a different tactile response when the calculated distance reaches the predetermined value.

7. A system switch device comprising:

a board switch having a plurality of switches, each of said plurality of switches being assigned a position, and each of said plurality of switches having a first setting and a second setting;

signal generating means for generating a position signal corresponding to the position of one of said plurality of switches when said one of said plurality of switches is placed in said first setting;

memory means for storing the position signal;

calculating means for calculating a distance between a switch which is first activated and a next activated switch based on the position signal associated with the first activated switch stored in said memory means and the position signal associated with the next activated switch stored in said memory means;

electronic control means for controlling terminal units according to the calculated distance when said next activated switch is placed in said second setting;

touch operate means for imparting a tactile sensation to a user when said next activated switch is placed in said second setting; and display means for displaying a selected content in accordance with the position signal.

* * * * *